(12) United States Patent
Sugai

(10) Patent No.: US 9,176,169 B2
(45) Date of Patent: Nov. 3, 2015

(54) PROBE APPARATUS AND TEST APPARATUS

(71) Applicant: ADVANTEST CORPORATION, Tokyo (JP)

(72) Inventor: Katsushi Sugai, Saitama (JP)

(73) Assignee: ADVANTEST CORPORATION, Tokyo (JP)

( * ) Notice: Subject to any disclaimer, the term of this patent is extended or adjusted under 35 U.S.C. 154(b) by 148 days.

(21) Appl. No.: 14/025,841

(22) Filed: Sep. 13, 2013

(65) Prior Publication Data

US 2014/0145742 A1    May 29, 2014

(30) Foreign Application Priority Data

Nov. 29, 2012 (JP) ................................. 2012-261507

(51) Int. Cl.
*G01R 1/073* (2006.01)
*G01R 31/28* (2006.01)

(52) U.S. Cl.
CPC ........ *G01R 1/07378* (2013.01); *G01R 31/2889* (2013.01); *G01R 31/2893* (2013.01)

(58) Field of Classification Search
None
See application file for complete search history.

(56) References Cited

U.S. PATENT DOCUMENTS

| | | | |
|---|---|---|---|
| 6,335,627 B1 * | 1/2002 | Gospe ...................... | 324/750.22 |
| 6,420,888 B1 * | 7/2002 | Griffin et al. ............. | 324/754.11 |
| 6,522,162 B2 * | 2/2003 | Griffin et al. ............. | 324/756.05 |
| 6,704,207 B2 * | 3/2004 | Kopf ........................... | 361/760 |
| 2003/0099097 A1 * | 5/2003 | Mok et al. ..................... | 361/767 |
| 2004/0012400 A1 * | 1/2004 | Sauk et al. .................... | 324/754 |
| 2004/0223309 A1 * | 11/2004 | Haemer et al. ................ | 361/767 |
| 2005/0093568 A1 * | 5/2005 | Ohara ............................ | 326/30 |
| 2008/0061808 A1 * | 3/2008 | Mok et al. ..................... | 324/758 |
| 2008/0076297 A1 * | 3/2008 | Matsumura et al. .......... | 439/578 |
| 2009/0201029 A1 * | 8/2009 | Asano et al. .................. | 324/555 |
| 2009/0206858 A1 * | 8/2009 | Shibuya ........................ | 324/755 |
| 2009/0295417 A1 * | 12/2009 | Watanabe et al. ............. | 324/761 |
| 2010/0102837 A1 * | 4/2010 | Abe et al. ...................... | 324/754 |
| 2011/0121848 A1 * | 5/2011 | Komoto et al. ........... | 324/754.18 |
| 2012/0033208 A1 * | 2/2012 | Hara et al. .................... | 356/244 |
| 2012/0049876 A1 * | 3/2012 | Matsumura et al. ....... | 324/754.2 |
| 2012/0212247 A1 * | 8/2012 | Sakata et al. ............. | 324/754.03 |

FOREIGN PATENT DOCUMENTS

JP         2010-204096 A        9/2010

* cited by examiner

*Primary Examiner* — Jermele M Hollington
*Assistant Examiner* — Suresh K Rajaputra

(57) ABSTRACT

A probe apparatus providing an electrical connection between a device under test and a test apparatus body, comprising a device-side terminal unit including a flexible sheet and device-side connection terminals passing through the sheet and connected to the device under test; an intermediate substrate provided on the test apparatus body side of the device-side terminal unit and including device-side intermediate electrodes electrically connected to the device-side connection terminals and tester-side intermediate electrodes electrically connected to the test apparatus body; a tester-side substrate that is provided on the test apparatus body side of the intermediate substrate and includes, on the intermediate substrate side thereof, tester-side electrodes electrically connected to the test apparatus body; and a contact section provided between the intermediate substrate and the tester-side substrate and including first pins connected to the tester-side intermediate electrodes and second pins connected to the tester-side electrodes.

2 Claims, 12 Drawing Sheets

340

PROBE APPARATUS AND TEST APPARATUS

BACKGROUND

1. Technical Field

The present invention relates to a probe apparatus and a test apparatus.

2. Related Art

A conventional test apparatus is known that transports and secures one wafer at a time, electrically connects to a plurality of semiconductor integrated circuits formed on the wafer, and performs testing, such as shown in Patent Document 1. Patent Document 1: Japanese Patent Application Publication No. 2010-204096

However, the number of semiconductor integrated circuits formed on a single wafer and the number and density of electrodes that are to be electrically connected have been increasing. As a result, the component mounting density in probe apparatuses that are electrically connected between a test apparatus body and a wafer has increased, and this makes it difficult to realize a spacious design when arranging the electronic circuit elements.

SUMMARY

Therefore, it is an object of an aspect of the innovations herein to provide a probe apparatus and a test apparatus, which are capable of overcoming the above drawbacks accompanying the related art. The above and other objects can be achieved by combinations described in the claims. According to a first aspect of the present invention, provided is a probe apparatus that provides an electrical connection between a device under test and a test apparatus body, comprising a device-side terminal unit that includes a flexible sheet and a plurality of device-side connection terminals passing through the sheet and connected to the device under test; an intermediate substrate that is provided on the test apparatus body side of the device-side terminal unit and includes a plurality of device-side intermediate electrodes electrically connected to the device-side connection terminals and a plurality of tester-side intermediate electrodes electrically connected to the test apparatus body; a tester-side substrate that is provided on the test apparatus body side of the intermediate substrate and includes, on the intermediate substrate side thereof, a plurality of tester-side electrodes electrically connected to the test apparatus body; and a contact section that is provided between the intermediate substrate and the tester-side substrate and includes a plurality of first pins connected to the tester-side intermediate electrodes and a plurality of second pins connected to the tester-side electrodes. Also provided is a test apparatus.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
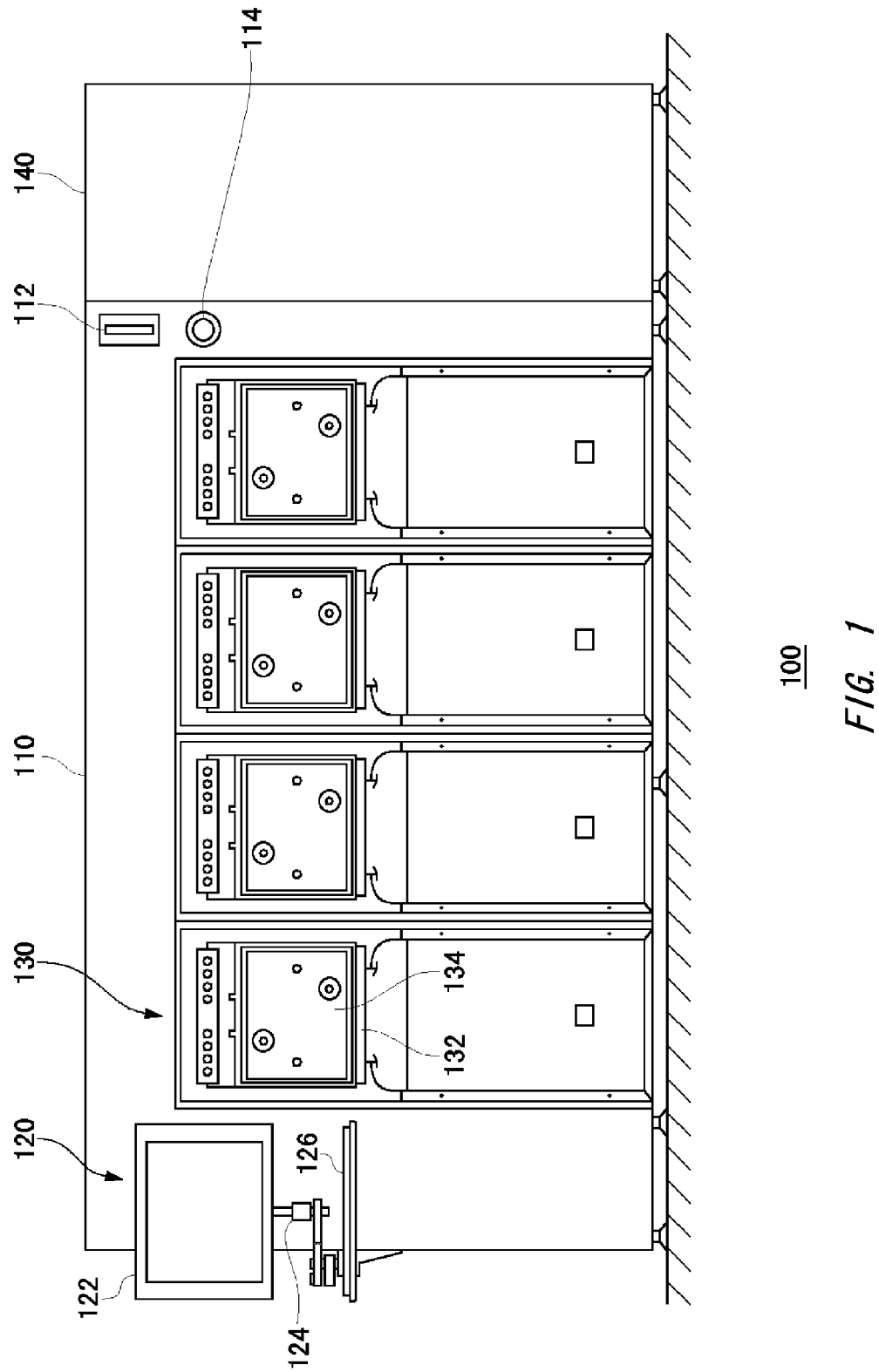
FIG. 1 is a front view of the entirety of a test apparatus 100 according to the present embodiment.

FIG. 1 is a front view of the entirety of a test apparatus 100 according to the present embodiment. The test apparatus 100 transports a wafer having a plurality of devices under test formed thereon within the apparatus, brings the semiconductor wafer into contact with a contact destination at a suitable location, and tests the devices under test.

The test apparatus 100 tests devices under test such as analog circuits, digital circuits, memories, and systems on chips (SOC). The test apparatus 100 inputs to each device under test a test signal based on a test pattern for testing the device under test, and judges pass/fail of the device under test based on an output signal output by the device under test in response to the test signal. The test apparatus 100 includes an EFEM 110, a manipulating section 120, a load unit 130, and a cooler 140.

The EFEM 110 (Equipment Front End Module) houses a mechanism that transports a substrate serving as the test target within the test apparatus 100. In the test apparatus 100, the EFEM 110 has the largest dimensions, and therefore the signal lamp 112 that indicates the operational state of the test apparatus 100 and an EMO 114 (EMergency OFF) that operates when the test apparatus 100 is to be suddenly stopped are arranged at positions high on the front surface of the EFEM 110.

The manipulating section 120 is also supported by the EFEM 110. The manipulating section 120 includes a display 122, an arm 124, and an input apparatus 126. One end of the arm 124 is connected to the EFEM 110 and the other end supports the display 122 and the input apparatus 126 in a freely movable manner.

The display 122 may include a liquid crystal display apparatus, for example, that displays the operational state of the test apparatus 100 or echo back of the input content from the input apparatus 126, for example. The input apparatus 126 may include a keyboard, mouse, tracking ball, and/or jog dial, for example, and receives settings or manipulations of the test apparatus 100, for example.

The load unit 130 includes a load table 132 and a load gate 134. The load table 132 has a container housing the semiconductor wafer serving as the test target mounted thereon. The load gate 134 opens and closes when the semiconductor wafer is transported into or out of the test apparatus 100. In this way, the semiconductor wafer can be loaded from the outside without reducing the cleanliness within the test apparatus 100.

The cooler 140 heats and supplies a heating medium that circulates within the test apparatus 100, when heating the temperature around the wafer to a target temperature during testing by the test apparatus 100, for example. The cooler 140 supplies a cooled cooling medium when cooling the wafer before transport that has become heated by the testing operation in the test apparatus 100. Therefore, the cooler 140 includes a heat exchanger and is arranged near the test head that performs testing. The cooler 140 may be omitted from the test apparatus 100 if a source supplying the heated or cooled thermal medium is provided separately outside of the test apparatus 100.

Figure 2:
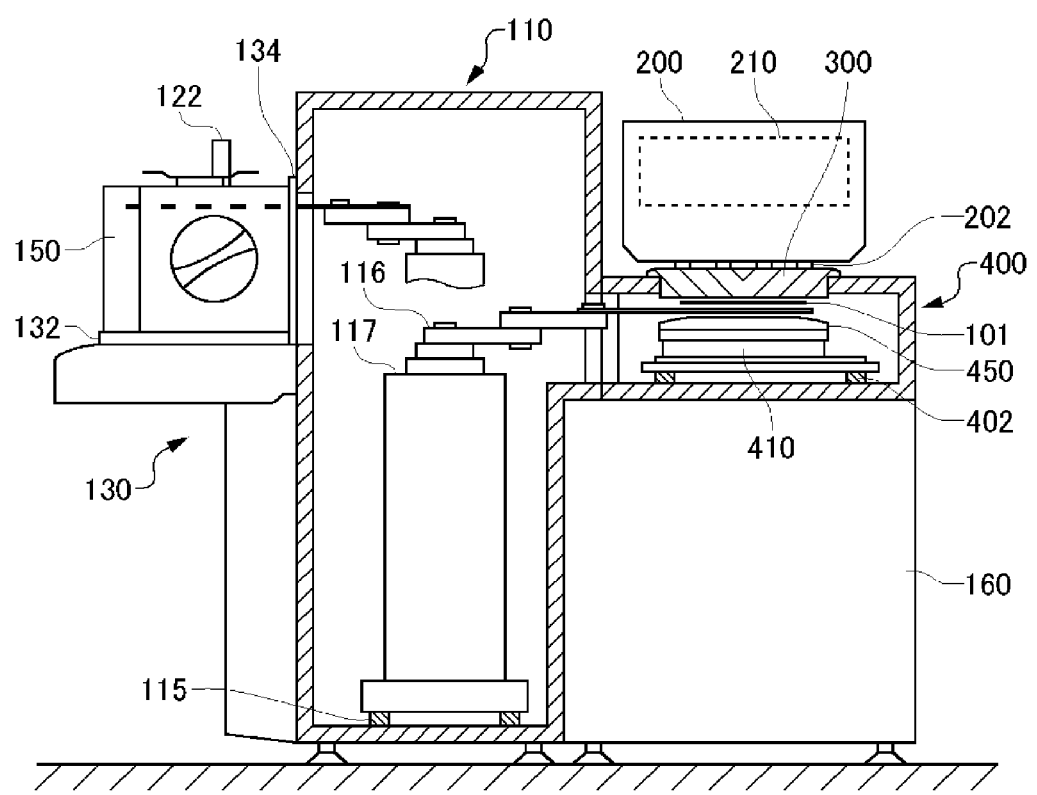
FIG. 2 is a partial cross-sectional view of the test apparatus 100 according to the present embodiment.

FIG. 2 is a partial cross-sectional view of the test apparatus 100 according to the present embodiment. In FIG. 2, components identical to those in FIG. 1 are given the same reference numerals and redundant descriptions are omitted. The test apparatus 100 includes a load unit 130, an EFEM 110, a main frame 160, an alignment unit 400, a probe apparatus 300, and a test head 200. FIG. 2 omits the cooler 140 from view.

In the test apparatus 100, the load unit 130, the EFEM 110, and the main frame 160 are arranged adjacently in the stated order from front (the left side in FIG. 2) to back (the right side in FIG. 2). Furthermore, the alignment unit 400, the probe apparatus 300, and the test head 200 are stacked on the main frame 160, for example.

A FOUP 150 (Front Opening Unified Pod) is mounted on the load table 132 of the load unit 130. The FOUP 150 stores a plurality of semiconductor wafers 101 to serve as test targets. Semiconductor wafers are also stored in the FOUP 150 when recycling the semiconductor wafers 101 after testing is finished.

The EFEM 110 houses the robot arm 116. The robot arm 116 is mounted on a column 117 that runs along a rail 115, and transports the semiconductor wafer 101 between the load unit 130 and the alignment unit 400. Therefore, the load unit 130 and the EFEM 110 have an air-tight connection and the alignment unit 400 and the EFEM 110 have an air-tight connection, thereby maintaining high cleanliness within these regions.

The main frame 160 controls the overall operation of the test apparatus 100. For example, the main frame 160 is connected to the test head 200, the probe apparatus 300, and the alignment unit 400, and performs testing while synchronizing each component. Furthermore, the main frame 160 is connected to the manipulating section 120, receives input from the input apparatus 126, and reflects this input in each component of the test apparatus 100. The main frame 160 generates display content that reflects the operational state of the test apparatus 100, and displays this content in the display 122.

The main frame 160 synchronizes operation of the load unit 130, the EFEM 110, and the alignment unit 400, to pass the semiconductor wafer 101 between these sections. Furthermore, when the EMO 114 is manipulated, the main frame 160 immediately stops the operation of each component of the test apparatus 100.

The alignment unit 400 transports a target object and corrects misalignment of the transport destination. The alignment unit 400 transports a plurality of target objects to each of a plurality of transport destinations. Here, the target objects may be semiconductor substrates, glass substrates, or semiconductor devices formed as chips, for example. The target objects are transported by a transport apparatus such as a stage or robot, and may be substrates, devices, components, apparatuses, or chasses held at a predetermined position at the transport destination.

The present embodiment describes a semiconductor wafer 101 and a wafer tray 450, as an example of target objects. The misalignment correction operation performed by the alignment unit 400 is described further below. The alignment unit 400 includes an alignment stage 410.

The alignment stage 410 has the wafer tray 450 and the semiconductor wafer 101 mounted thereon, and runs along the rail 402. The alignment stage 410 moves vertically, and can raise and lower the semiconductor wafer 101 mounted thereon. In this way, after the semiconductor wafer 101 has been aligned with the probe apparatus 300, the wafer 101 is pressed against the probe apparatus 300 positioned thereabove.

The probe apparatus 300 is electrically connected to a plurality of electrodes formed on the semiconductor wafer 101. When the test apparatus 100 performs testing, the semiconductor wafer 101 and the test head 200 are electrically connected with the probe apparatus 300 interposed therebetween. In this way, an electrical signal path is created between the test head 200 and the semiconductor wafer 101.

Here, the probe apparatus 300 includes probes that correspond to the arrangement of the electrodes formed on the semiconductor wafer 101 and connect electrically to these electrodes. In other words, the test apparatus 100 can be made to correspond to semiconductor wafers 101 with different layouts by exchanging the probe apparatus 300.

The test head 200 stores a plurality of pin electronics 210. The pin electronics 210 include electrical circuits that correspond to the content of the testing and the target of the testing. The test head 200 is electrically connected to the probe apparatus 300 via contactors attached to the bottom surface of the test head 200. The semiconductor wafer 101 is electrically connected to the pin electronics 210 to exchange electrical signals with the pin electronics 210.

The test apparatus 100 described above has the load table 132 mounted thereon with the semiconductor wafer 101 to be tested housed in the FOUP 150. The robot arm 116 takes one semiconductor wafer 101 at a time through the load gate 134 and transports the semiconductor wafer 101 to the alignment unit 400.

In the alignment unit 400, the wafer 101 is mounted on a wafer tray 450 on the alignment stage 410. After the mounted wafer 101 is aligned with the probe apparatus 300, the alignment stage 410 presses the probe apparatus 300 from above.

Figure 3:
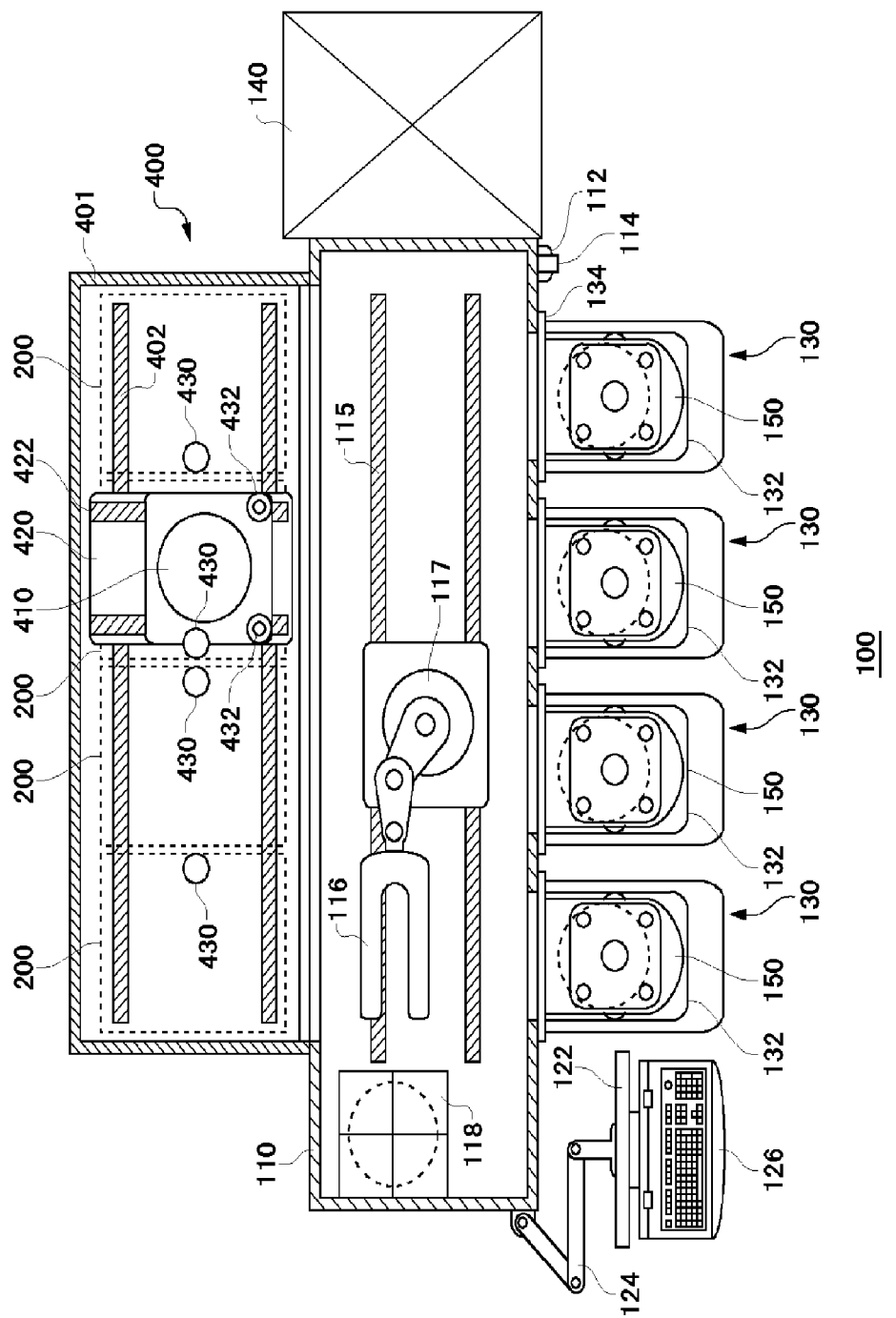
FIG. 3 is a partial horizontal cross-sectional view of the test apparatus 100 according to the present embodiment.

FIG. 3 is a partial horizontal cross-sectional view of the test apparatus 100 according to the present embodiment. In FIG. 3, components identical to those in FIG. 1 or 2 are given the same reference numerals and redundant descriptions are omitted. The test apparatus 100 includes four load units 130 and four test heads 200. Furthermore, each load unit 130 includes a FOUP 150.

One EFEM 110 and one alignment unit 400 are provided. The alignment unit 400 includes a single alignment stage 410.

In the EFEM 110, the column 117 supporting the robot arm 116 moves along the rail 115 over substantially all of the width of the EFEM 110. Accordingly, the robot arm 116 can transport the semiconductor wafer 101 to any of the four load units 130 and four test heads.

A pre-aligner 118 is arranged in the EFEM 110 at the end opposite the cooler 140, for example. The pre-aligner 118 adjusts the mounting position of the semiconductor wafer 101 relative to the robot arm 116, with a predetermined accuracy. For example, the pre-aligner 118 performs the adjustment with an accuracy that is less than the accuracy of the positioning of the test head 200.

In this way, the initial positioning accuracy when the robot arm 116 mounts the semiconductor wafer 101 on the wafer tray 450 is improved, and the time needed to align the semiconductor wafer 101 with the probe apparatus 300 is reduced. Furthermore, the throughput of the test apparatus 100 is improved.

The alignment unit 400 includes rails 402 and 422, a stage carrier 420, an alignment stage 410, a wafer camera 430, and a stage camera 432. The rails 402 are arranged to span the entire width of the bottom surface of the chassis 401. The stage carrier 420 moves in the longer dimension of the chassis 401 along the rails 402.

The stage carrier 420 includes the rails 422 on the top surface thereof that are orthogonal to the rails 402 of the chassis 401. The alignment stage 410 moves in the shorter dimension of the chassis 401 above the rails 422.

A plurality of wafer cameras 430 are arranged near the probe apparatuses 300 to correspond to each test head 200. These wafer cameras 430 are arranged on the ceiling of the chassis 401 and aimed downward.

The stage cameras 432 are mounted on the stage carrier 420 along with the alignment stage 410, and move together with the alignment stage 410. The stage cameras 432 are arranged to point upward.

The wafer cameras 430 and the stage cameras 432 can be used to align the wafer 101 on the alignment stage 410 with the probe apparatus 300. Specifically, when the wafer 101 is mounted on the alignment stage 410, the position of the wafer 101 is determined with a prealignment accuracy. Then, the wafer cameras 430 that point downward can accurately detect the position of the wafer 101 on the alignment stage 410 by detecting the edges or predetermined alignment marks, for example, of the wafer 101.

The relative position of the stage camera 432 arranged on the alignment stage 410 is known with respect to the alignment stage 410. A reference mark is provided at a predetermined relative position of the chassis 401 with respect to the probe apparatus 300, and this reference mark is detected by the stage cameras 432 while the alignment stage 410 is moved. In this way, the difference between the position of the wafer 101 and the position of the probe apparatus 300 can be detected, and the wafer 101 and the probe apparatus 300 can be aligned by moving the alignment stage 410 in a manner to eliminate this difference.

The position of the wafer cameras 430 arranged in the chassis 401 relative to the probe apparatus 300 is already known. The difference between the position of the wafer 101 and the position of the probe apparatus 300 may be calculated and the alignment stage 410 may be moved to compensate for this difference, thereby aligning the wafer 101 and the probe apparatus 300.

When detecting the wafer 101, manual alignment may be performed using a video from the wafer cameras 430 displayed on the display 122. As another example, the test apparatus 100 may perform alignment automatically by referencing a fiducial mark provided on the wafer tray 450 or the like.

As described above, the test apparatus 100 of the present embodiment transports the semiconductor wafers 101 stored in the FOUP 150 one at a time into the alignment unit 400 using the robot arm 116. The test apparatus 100 presses the semiconductor wafer 101 onto the probe apparatus 300 while setting the position of the semiconductor wafer 101 in the alignment unit 400, and holds the semiconductor wafer 101 and the probe apparatus 300 in an electrically connected state.

The test apparatus 100 separates the semiconductor wafer 101 that has been tested from the probe apparatus 300 and transports this semiconductor wafer 101 from the alignment unit 400 to the FOUP 150. The test apparatus 100 repeats this operation to sequentially test the semiconductor wafers 101 stored in the FOUP 150.

The test apparatus 100 holds each semiconductor wafer 101 for each probe apparatus 300 of the test head 200, and performs testing by exchanging electrical signals with each of the semiconductor wafers 101. In the present embodiment, the test apparatus 100 holds up to four semiconductor wafers 101 on four probe apparatuses 300 corresponding to the test head 200, and tests each of the devices formed on each of the four semiconductor wafers 101.

Figure 4:
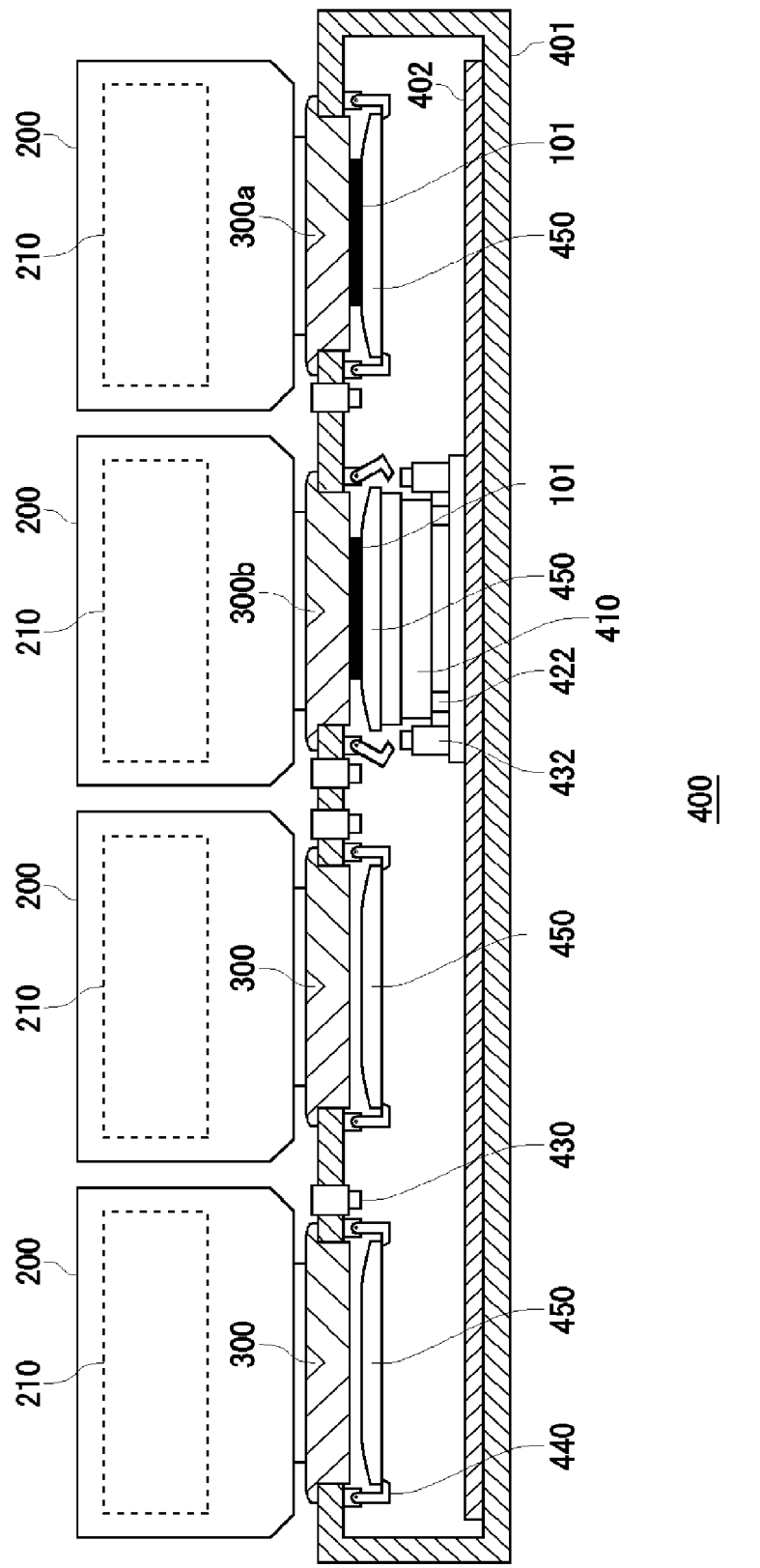
FIG. 4 is a partial vertical cross-sectional view of the alignment unit 400 according to the present embodiment.

FIG. 4 is a partial vertical cross-sectional view of the alignment unit 400 according to the present embodiment. In FIG. 4, components identical to those in FIG. 1 or 3 are given the same reference numerals and redundant descriptions are omitted. The alignment unit 400 includes a chassis 401, an alignment stage 410, and a hanger hook 440.

The chassis 401 includes a plurality of test heads 200 and has a width corresponding to four test heads 200, for example. Four probe apparatuses 300 corresponding to the test heads 200 are attached on the top surface of the chassis 401. Furthermore, opening and closing hanger hooks 440 are provided on the ceiling within the chassis 401, at locations to correspond to each of the test heads 200.

The hanger hooks 440 hold the wafer tray 450 when closed to support the wafer tray 450 directly below the probe apparatus 300. When the hanger hooks 440 are open, the wafer tray 450 is released. In this way, the alignment unit 400 can keep each wafer tray 450 in standby directly below the probe apparatus 300 of the respective test head 200.

The alignment stage 410 can move each test head 200 downward along the rails 402 arranged on the bottom surface of the chassis 401. The alignment stage 410 can extend and contract vertically to raise and lower the wafer trays 450.

In the alignment unit 400 having the configuration described above, a wafer tray 450 held by hanger hooks 440 is mounted on an alignment stage 410 by raising the alignment stage 410 from below. After this, the wafer tray 450 is released from the hanger hooks 440 by lowering the alignment stage 410 with the hanger hooks 440 in an opened state.

The robot arm 116 of the EFEM 110 mounts a wafer 101 on the wafer tray 450 whose top surface is free due to lowering of the alignment stage 410. In this way, the alignment stage 410 can have the wafer mounted thereon while held on the wafer tray 450.

Next, the alignment stage 410 raises the wafer tray 450 while aligning the wafer 101 with the probe apparatus 300, and presses the wafer 101 to the bottom surface of the probe apparatus 300. The wafer tray 450 electrically connects the wafer 101 and the probe apparatus 300 securely by suctioning the wafer 101 to the probe apparatus 300. Instead, the probe apparatus 300 may suction the pressed wafer tray 450 and the wafer 101 to itself.

The alignment stage 410 moves on without the wafer 101 and the wafer tray 450, and transports another wafer 101. In this way, the wafers 101 can be attached to the test heads 200.

If the wafers 101 that have been tested are to be recycled, the series of operations described above may be performed in the opposite order. In this way, the wafers 101 can be transported by the robot arms 116 and the wafer trays 450 can be placed directly under the test heads 200.

In the example shown in FIG. 4, the wafer tray 450 and the wafer 101 are fixed to the probe apparatus 300a under the test head 200 on the right side of the drawing. When a hanger hook 440 is closed and the corresponding wafer tray 450 has the probe apparatus 300 suctioned thereto, the hanger hook 440 need not contact the wafer tray 450.

Directly below the test head 200 that is second from the right in FIG. 4, a wafer tray 450 and the wafer 101 mounted thereon are pressed up and securely attached to the bottom surface of the probe apparatus 300b, by the alignment stage 410. Under the other test heads 200, the hanger hooks 440 are holding the wafer trays 450 in standby.

In this way, in the alignment unit 400, the wafer trays 450 corresponding to the respective four test heads 200 are provided. As a result, each test head 200 can individually test a wafer 101.

The test heads 200 may all perform the same type of testing, or may each perform a different type of testing. In the latter case, the throughput of the test apparatus 100 can be improved by assigning a plurality of test heads for tests that take a long time.

In this way, in the test apparatus 100, a single alignment stage 410 and robot arm 116 are used for a plurality of test heads 200. As a result, the usage efficiency of the robot arm 116 and the alignment stage 410 that are not needed during testing can be improved.

Figure 5:
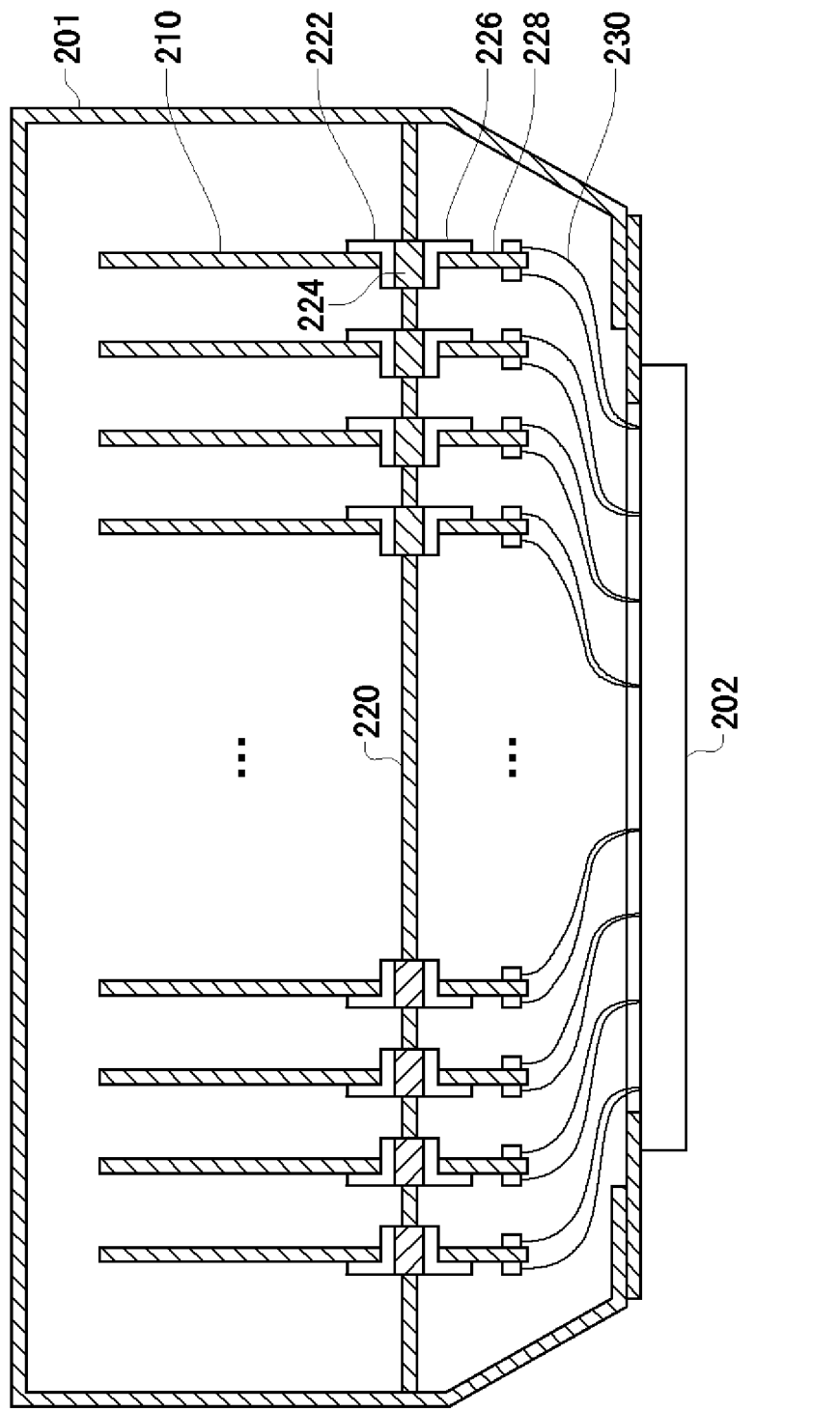
FIG. 5 is a cross-sectional view of a test head 200 according to the present embodiment.

FIG. 5 is a cross-sectional view of a test head 200 according to the present embodiment. In FIG. 5, the components that are the same as those described in FIGS. 1 to 4 are given the same reference numerals, and further description is omitted. The test head 200 includes a chassis 201, a contactor 202, pin electronics 210, a motherboard 220, and a flat cable 230.

The motherboard 220 is arranged horizontally within the chassis 201 and includes a plurality of relay connectors 224. Each relay connector 224 includes receptacles arranged on the top surface side and bottom surface side of the motherboard 220, and forms a signal path through the motherboard 220.

On the top surface of the motherboard 220, a pin electronic 210 is connected to each relay connector 224 via an angle connector 222. With this configuration, the pin electronics 210 can be replaced according to the specifications of the testing target and the testing content.

The pin electronics 210 operate as a testing section that tests a plurality of devices under test formed on the wafer 101 by exchanging electrical signal with the devices under test. For example, the testing section may input to each device under test a test signal based on a test pattern for testing the devices under test. Furthermore, the testing section judges pass/fail of each of the devices under test based on output signals output respectively from the devices under test in response to the test signals.

The pin electronics 210 may have the same specifications as each other, or may have different specifications from each other. A portion of the relay connectors 224 need not be provided with pin electronics 210.

On the bottom surface of the motherboard 220, each relay connector 224 is connected to a small substrate 228 via an angle connector 226. Each small substrate 228 is connected to one end of a flat cable 230. In this way, the pin electronics 210 within the chassis 201 can be connected to a contactor 202, which is described further below, via the flat cable 230 or the like.

The contactor 202 is attached to the bottom surface of the chassis 201. The contactor 202 is connected to the probe apparatus 300, and is electrically connected between the main body of the test apparatus and the devices under test formed on the wafer 101.

Figure 6:
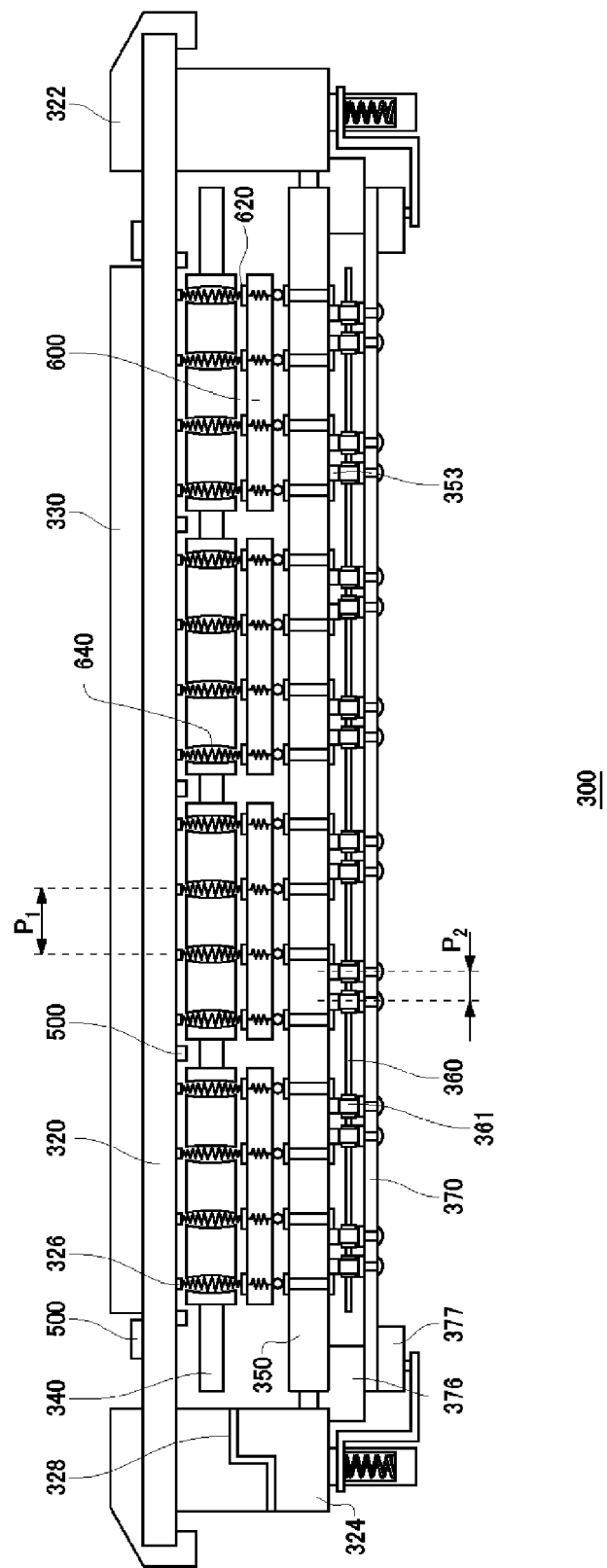
FIG. 6 is a cross-sectional view of a probe apparatus 300 according to the present embodiment.

FIG. 6 is a cross-sectional view of a probe apparatus 300 according to the present embodiment. The probe apparatus 300 electrically connects the testing section to the electrodes of the devices under test formed on the wafer 101. The probe apparatus 300 includes a tester-side substrate 320, a contactor 330, a contact section 340, an intermediate substrate 350, an anisotropic conductive film 360, and a device-side terminal unit 370.

The tester-side substrate 320 is provided on the test apparatus body side of the intermediate substrate 350, and includes on the intermediate substrate 350 side thereof a plurality of tester-side electrodes 326 that are electrically connected to the test apparatus body. In the present embodiment, the test apparatus body side refers to the test head 200 side. In other words, the tester-side substrate 320 has a tester-side electrode 326 formed by electrical wiring providing on the tester side surface that faces the test head 200 and on the device side surface facing the wafer 101 side. Furthermore, the tester-side substrate 320 includes electronic components 500 such as resistors, capacitors, coils, and/or semiconductor devices in regions of the tester side surface and the device side surface where other components are not mounted.

The tester-side substrate 320 is formed as a multilayer substrate, for example. The tester-side substrate 320 is formed of an insulating substrate with relatively high mechanical strength, such as a polyimide board. The edge portion of the tester-side substrate 320 may be sandwiched between the upper frame 322 and the lower frame 324, for example. In this way, the mechanical strength of the tester-side substrate 320 is further improved. The lower frame 324 may form a flow passage 328, for example. The flow passage 328 has one end that opens into the region within the probe apparatus 300. The other end of the flow passage 328 is connected to a depressurizing pump via a valve, for example.

The tester-side substrate 320 includes a contactor 330 on the tester side surface. The contactor 330 engages with the contactor 202 of the test head 200, thereby connecting a plurality of electrical wires. Furthermore, when the contactor 202 contacts the tester-side substrate 320, the contactor 330 may guide and position the contactor 202.

The contact section 340 is electrically connected to the tester-side substrate 320 at the tester side surface. The contact section 340 includes a through-electrode 640 that passes therethrough from the tester side surface to the device side surface.

The intermediate substrate 350 includes on the tester side surface tester-side intermediate electrodes 620 that are electrically connected to the contact section 340. The intermediate substrate 350 includes on the device side surface device-side intermediate electrodes 353 that are arranged with a different pitch than the tester-side intermediate electrodes 620. The device-side intermediate electrodes 353 are each electrically connected to a corresponding tester-side intermediate diate electrode 620. The intermediate substrate 350 may be a pitch converting substrate in which the wire pitch of the tester-side intermediate electrodes 620 is greater than the wire pitch of the device-side intermediate electrodes 353, for example.

The anisotropic conductive film 360 is electrically connected to the intermediate substrate 350 at the tester side surface. The anisotropic conductive film 360 includes through-electrodes 361 that penetrate therethrough from the tester side surface to the device side surface. The through-electrodes 361 have the same layout as the device-side intermediate electrodes 353 on the device surface side of the intermediate substrate 350. In this way, when the intermediate substrate 350 and the anisotropic conductive film 360 are layered and in close contact, the through-electrodes 361 and device-side intermediate electrodes 353 are electrically connected to each other.

The device-side terminal unit 370 is electrically connected to the anisotropic conductive film 360 at the tester side surface. The device-side terminal unit 370 is electrically connected to the wafer 101 at the device side surface.

Figure 7:
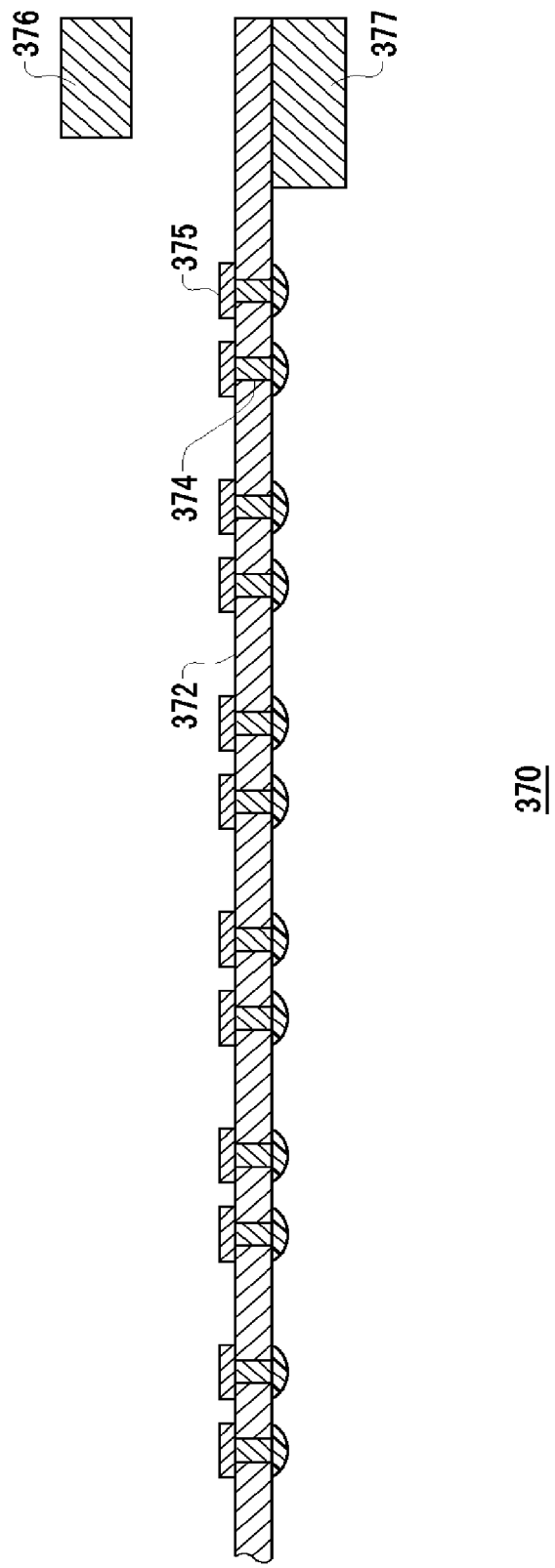
FIG. 7 is an enlarged partial cross-sectional view of the device-side terminal unit 370 according to the present embodiment.

FIG. 7 is an enlarged partial cross-sectional view of the device-side terminal unit 370 according to the present embodiment. The device-side terminal unit 370 includes a flexible elastic sheet 372 and a plurality of device-side connection terminals 374 that pass through the elastic sheet to be connected to the devices under test. The device-side terminal unit 370 also includes a frame 377.

The elastic sheet 372 is formed of an elastic insulating material. The device-side connection terminals 374 are formed as bumps with semi-spherical tips on the device surface side. Instead, the tips of the device-side connection terminals 374 may be protrusions, a flat surface that does not protrude, or pins with rounded tips.

The tips of the device-side connection terminals 374 are arranged with the same layout as the device pad provided for testing in the devices under test formed on the wafer 101 serving as the test target. Furthermore, the device-side connection terminals 374 are provided such that a plurality of device-side connection terminals 374 correspond to each device under test. In other words, on the device side surface of the probe apparatus 300, the device-side connection terminals 374 function as probe terminals for the wafer 101.

The device-side connection terminals 374 have contact pads 375 formed on the tester side surfaces. The contact pads 375 are arranged with substantially the same layout as the device pads formed on the wafer 101.

The frame 377 grips the edge of the elastic sheet 372, and keeps the elastic sheet 372 in a horizontal state. The device-side terminal unit 370 may be pressed from the frame 377 side to be fixed to the intermediate substrate 350 with the connecting section 376 interposed therebetween. The connecting section 376 is formed of an elastic material and is attached in an air-tight manner to the outer edge of the device-side terminal unit 370 and the intermediate substrate 350. In this way, the space between the intermediate substrate 350 and the device-side terminal unit 370 is sealed in an air-tight manner. The connecting section 376 may be a rubber sheet formed as a ring, for example. Instead, the connecting section 376 may be a rubber sheet formed as a circle in which the outer edge is thicker than the inner portions. In this case, the connecting section 376 includes an opening in the inner portion and the anisotropic conductive film 360 and device-side terminal unit 370 are electrically connected to each other through this opening.

Figure 8:
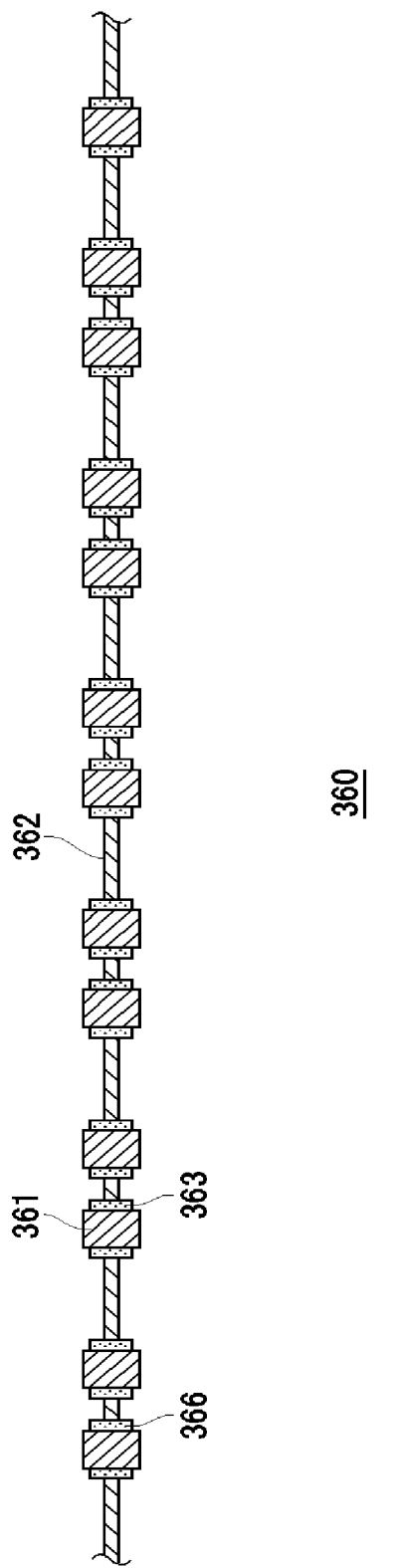
FIG. 8 is an enlarged partial cross-sectional view of the anisotropic conductive film 360 according to the present embodiment.

FIG. 8 is an enlarged partial cross-sectional view of the anisotropic conductive film 360 according to the present embodiment. The anisotropic conductive film 360 is arranged between the device-side terminal unit 370 and the intermediate substrate 350, and connected between the device-side connection terminals 374 and the device-side intermediate electrodes 353. The anisotropic conductive film 360 includes through-electrodes 361, a frame 362, and elastic supports 363.

The frame 362 is formed of a material with relatively high rigidity, such as metal, and includes a plurality of holes 366 that each have an inner diameter that is greater than the outer diameter of a through-electrode 361. Each through-electrode 361 is supported from the frame 362 via an elastic support 363, within a hole 366.

The elastic supports 363 are formed of a flexible material such as silicon rubber. The through-electrodes 361 each have a length that is greater than the thickness of the frame 362. As a result, when the anisotropic conductive film 360 is sandwiched between the device-side terminal unit 370 and the intermediate substrate 350, the variation in the evenness of the components is absorbed, and a good electrical connection can be formed.

The through-electrodes 361 are arranged with substantially the same layout as the contact pads 375 of the device-side terminal unit 370. In this way, when the anisotropic conductive film 360 and the device-side terminal unit 370 are stacked and in close contact, the device-side connection terminals 374 can be electrically connected to the corresponding through-electrodes 361.

Instead, the anisotropic conductive film 360 may be a film formed by diffusing a conductive substance substantially uniformly within an elastic insulating substance, such that conduction is realized in portions to which pressure is added. For example, the anisotropic conductive film 360 may be pressure conductive rubber. As a result, when the anisotropic conductive film 360 is sandwiched between the device-side terminal unit 370 and the intermediate substrate 350, pressure is applied to achieve electrical connection between the contact pads 375 and the device-side intermediate electrodes 353 and the elasticity acts to compensate for variation in the evenness of the components, thereby forming a good electrical connection.

Figure 9:
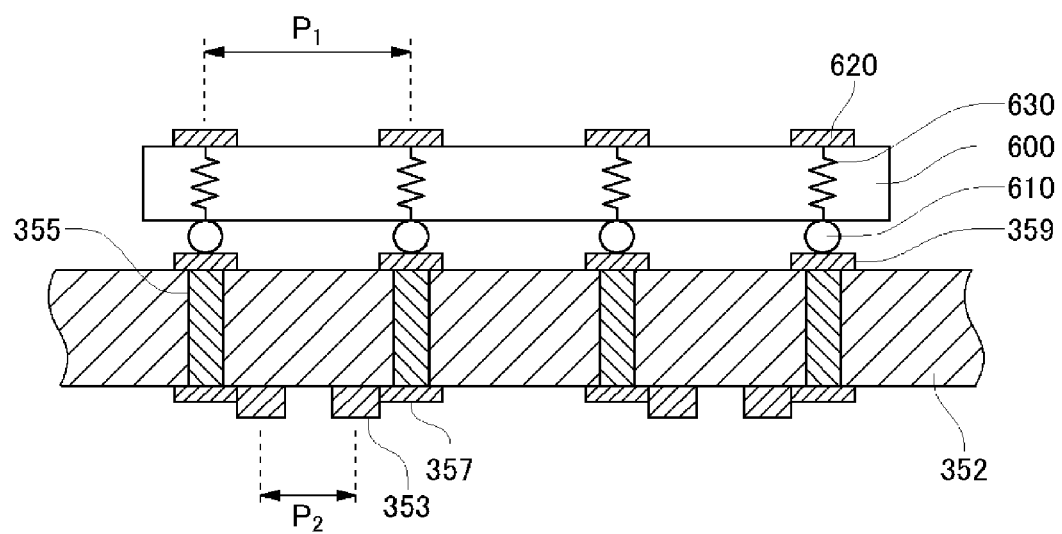
FIG. 9 is a partial cross-sectional view of the intermediate substrate 350 according to the present embodiment.

FIG. 9 is a partial cross-sectional view of the intermediate substrate 350 according to the present embodiment. The intermediate substrate 350 is provided on the test apparatus body side of the device-side terminal unit 370, and includes a plurality of device-side intermediate electrodes 353 that are electrically connected to a plurality of device-side connection terminals 374 and a plurality of tester-side intermediate electrodes 620 that are electrically connected to the test apparatus body.

The device-side intermediate electrodes 353 are arranged with substantially the same layout as the contact pads 375 of the device-side terminal unit 370. In other words, the device-side intermediate electrodes 353 of the present embodiment are arranged with the same layout as the device pads of the devices under test.

On the other hand, the tester-side intermediate electrodes 620 are arranged with intervals therebetween that are greater than the intervals between the device-side intermediate electrodes 353. FIG. 9 shows an example in which the wire pitch interval $P_1$ of the tester-side intermediate electrodes 620 is greater than the wire pitch interval $P_2$ of the device-side intermediate electrodes 353.

In this way, the intermediate substrate 350 converts the wire pitch of the device-side intermediate electrodes 353 formed to correspond to the device pads formed on the devices under test into a wire pitch with intervals greater than those of the device pads. The intermediate substrate 350 converts the wire pitch of the tester-side intermediate electrodes 620 to be a wire pitch with intervals of approximately 1 mm, while maintaining the correspondence with the device pads formed with a narrower pitch having intervals of 100 μm, for example.

The intermediate substrate 350 includes a substrate body 352 and a connection module 600. The substrate body 352 is a substrate including ceramic, for example. The substrate body 352 includes through-holes 355, wiring layers 357, and contact pads 359. The through-holes 355 are formed of conductive material and pass through the substrate body 352.

Each through-hole 355 is connected to a device-side intermediate electrode 353 via a wiring layer 357, on the device side surface. Each through-hole 355 is connected to a contact pad 359 on the tester side surface. In other words, the device-side intermediate electrodes 353 are electrically connected to the contact pads 359. In this way, the through-holes 355 electrically connect the device-side intermediate electrodes 353 to the contact pads 359 with the wiring layers 357 interposed therebetween, and therefore the wire pitch of the contact pads 359 can be different from the wire pitch of the device-side intermediate electrodes 353.

The connection module 600 is mounted above the test apparatus body side surface of the substrate body 352, and includes two or more substrate-side terminals 610 on the substrate body 352 side and two or more tester-side intermediate electrodes 620 on the side opposite the substrate body 352. In other words, in the connection module 600, the substrate-side terminals 610 and the corresponding contact pads 359 are electrically connected to each other on the device side surface. The substrate-side terminals 610 and the contact pads 359 may be secured by solders, for example. In this case, the substrate-side terminals 610 may be BGA (Ball Grid Array) electrodes formed of semi-spherical solders In the connection module 600, the tester-side intermediate electrodes 620 and the contact sections 340 are electrically connected to each other, on the tester side surface. The intermediate substrate 350 may have a plurality of connection modules 600 arranged thereon in a grid formation, or the connection modules 600 may be arranged in a predetermined formation that corresponds to the device pads of the device under test.

The connection module 600 includes an electronic component 630 that is connected to wires between the substrate-side terminals 610 and the tester-side intermediate electrodes 620. In other words, the substrate-side terminals 610 and the tester-side intermediate electrodes 620 of the connection module 600 are electrically connected via the electronic components 630.

The electronic components 630 may include resistance elements, for example. Instead of or in addition to this, the electronic components 630 may include capacitance elements and/or inductors. Instead of or in addition to this, the electronic components 630 may include active devices such as amplifiers or oscillators. In addition to this, the electronic components 630 may be dummy circuits including wires that connect the substrate-side terminals 610 to the tester-side intermediate electrodes 620.

In this way, the intermediate substrate 350 has the connection module 600 including the electronic components 630 mounted thereon, and therefore the region in which the electronic circuit elements can be arranged within the probe apparatus 300 is increased. Furthermore, the intermediate substrate 350 is formed by the separate components of the substrate body 352 and the connection module 600, and therefore each component has a greater degree of design freedom. By performing tests to determine whether proper operation is being realized for the substrate body 352 and the connection module 600, the yield of the intermediate substrate 350 can be improved.

With the intermediate substrate 350, the electronic circuit elements are arranged after the wire pitch is converted to be greater than the wire pitch of the device pads of the device under test, and therefore the connection module 600 including the electronic circuit elements can be easily formed. Furthermore, with the intermediate substrate 350, compared to the test head 200, the electronic circuit elements can be arranged nearer the device under test, and the electronic circuit elements can be arranged immediately after the conversion to the greater wire pitch. Therefore, the intermediate substrate 350 can reduce deterioration of signal quality, for example, when transmitting a high-speed signal.

Figure 10:
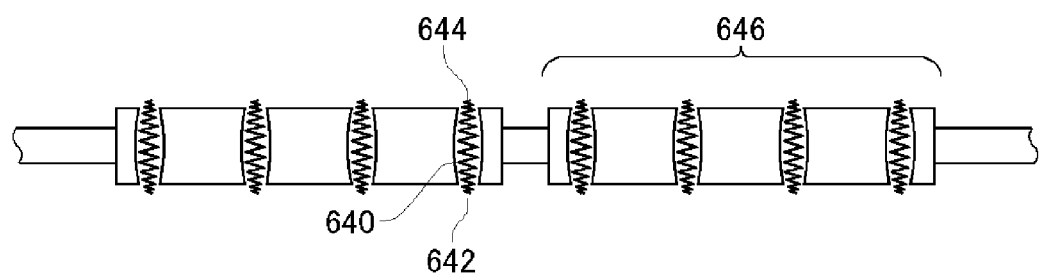
FIG. 10 is a planar view of the contact section 340 according to the present embodiment.

FIG. 10 is a planar view of the contact section 340 according to the present embodiment. The contact section 340 is provided between the intermediate substrate 350 and the tester-side substrate 320, and includes a plurality of first pins 642 connected to the plurality of tester-side intermediate electrodes 620 and a plurality of second pins 644 connected to the tester-side electrodes 326. The first pins 642 are device side terminals of the through-electrodes 640 and the second pins 644 are tester side terminals of the through-electrodes 640.

The through-electrodes 640 include springs or the like, and are probe pins that extend and contract between the first pins 642 and the second pins 644. The through-electrodes 640 may be pogo pins, spring pins, or spring probes, for example.

In this way, when the intermediate substrate 350 is moved toward the tester-side substrate 320, the tester-side intermediate electrodes 620 and the corresponding first pins 642 are pressed together to be electrically connected, and the tester-side electrodes 326 and the corresponding second pins 644 are pressed together to be electrically connected. In this case, the intermediate substrate 350 moves in the direction of the tester-side substrate 320 as a result of the inside of the probe apparatus 300 being depressurized from the flow passage 328, for example.

The contact section 340 includes a plurality of contact blocks 646 that each include two or more first pins 642 and two or more second pins 644, and the plurality of contact blocks 646 are connected to the plurality of connection modules 600. In other words, the contact section 340 includes a plurality of contact blocks 646 corresponding to the plurality of connection modules 600, and each contact block 646 is electrically connected to a corresponding connection module 600.

In this way, the contact section 340 electrically connects the tester-side intermediate electrodes 620 and the tester-side electrodes 326 between the intermediate substrate 350 and the tester-side substrate 320, by using the plurality of first pins 642 and the plurality of second pins 644. As a result, unlike an anisotropic conductive film or the like, for example, components are not arranged on the device side surface of the tester-side substrate 320 in regions where tester-side electrodes 326 are not formed.

Accordingly, the contact section 340 can create space in which electronic components 500 such as resistors, capacitors, coils, and/or semiconductor elements can be mounted, within the region on the device side surface of the tester-side substrate 320 where no components are arranged. In other words, the probe apparatus 300 according to the present embodiment increases the degree of spatial design freedom for arranging the electronic circuit elements.

The probe apparatus 300 according to the present embodiment described above is formed as a single body by combining the tester-side substrate 320, the contact section 340, the intermediate substrate 350, the anisotropic conductive film 360, and the device-side terminal unit 370. In this case, the probe apparatus 300 is secured by the depressurizing from the flow passage 328 and the pressing from the frame 377 side, for example.

Furthermore, when the probe apparatus 300 is secured as a single body, an electrical connection is formed that starts from the device-side connection terminals 374 connected to the device pads of the device under test and reaches the corresponding tester-side electrodes 326. Therefore, the pin electronics 210 of the test head 200 can exchange electrical signals with the device under test via the corresponding tester-side electrodes 326, thereby testing the device under test.

Figure 11:
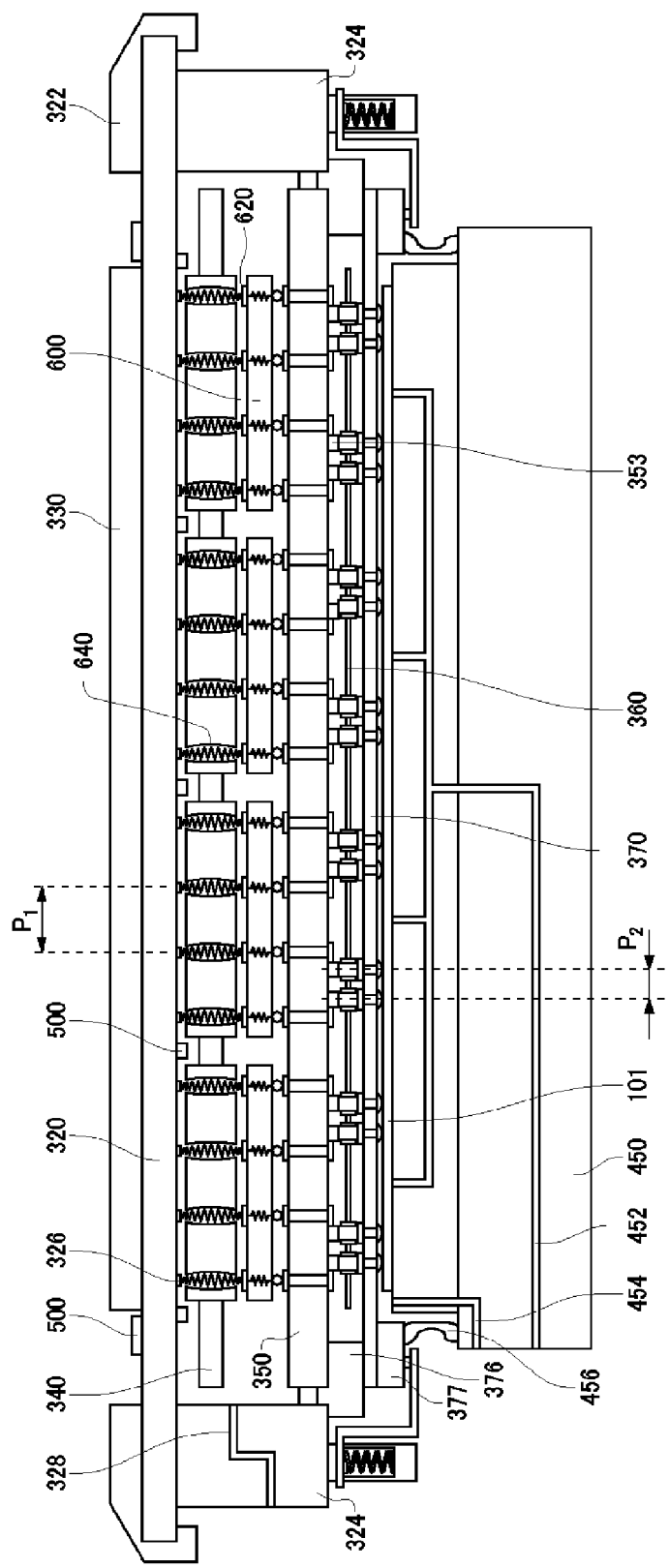
FIG. 11 is a cross-sectional view of a state in which the wafer 101 is fixed on the probe apparatus 300 according to the present embodiment.

FIG. 11 is a cross-sectional view of a state in which the wafer 101 is fixed on the probe apparatus 300 according to the present embodiment. In FIG. 11, components that are the same as those shown in FIG. 6 are given the same reference numerals, and redundant descriptions are omitted. The wafer 101 is fixed to the probe apparatus 300 by being mounted on the wafer tray 450.

The wafer tray 450 includes flow passages 452 and 454 and a diaphragm 456. The flow passage 452 has one end that opens in a region where the wafer 101 is mounted on the top surface of the wafer tray 450, which is the probe apparatus 300 side surface. The other end of the flow passage 452 is connected to a depressurizing pump via a valve, for example. In this way, the wafer tray 450 holds the wafer 101 in the mounted state through suction.

The flow passage 454 of the wafer tray 450 has one end that opens outside of the region where the wafer 101 is mounted on the top surface of the wafer tray 450. The other end of the flow passage 454 is connected to a depressurizing pump via a valve, for example.

The diaphragm 456 is formed of an elastic material and is attached in an air-tight manner to the edge of the wafer tray 450 further outward from the opening of the flow passage 454. When the alignment stage 410 is raised to press the wafer 101 against the probe apparatus 300 from below, the top end of the diaphragm 456 also contacts the bottom surface of the probe apparatus 300, thereby sealing the space between the wafer tray 450 and the probe apparatus 300 to be air-tight. As a result, when the pressure is reduced from the flow passage 454 while the wafer 101 is in the mounted state, the wafer tray 450 is suctioned to the bottom surface of the probe apparatus 300 and the held wafer 101 is pressed against the probe apparatus 300.

Here, holes may be provided in the elastic sheet 372 of the device-side terminal unit 370 positioned on the lowest surface of the probe apparatus 300. In this way, when the space between the probe apparatus 300 and the wafer tray 450 is depressurized, the pressure within the probe apparatus 300 is also reduced. As a result, the intermediate substrate 350, the anisotropic conductive film 360, and the device-side terminal unit 370 of the probe apparatus 300 are pressed against each other, thereby reliably forming a signal path from the wafer 101 to the test head 200.

The space within the probe apparatus 300 according to the present embodiment is divided by the intermediate substrate 350 into a tester side space and a device side space, and each of these spaces can be independently depressurized. Therefore, with the intermediate substrate 350 already safely secured, the wafer tray 450 can be attached or removed, for example. Instead, if the intermediate substrate 350 can be safely secured using a guide rail or the like, the probe apparatus 300 may depressurize both spaces together as a single space.

In this way, the probe apparatus 300 and the wafer 101 mounted on the wafer tray 450 are aligned and the device pads formed on the wafer 101 are electrically connected to the corresponding tester-side electrodes 326, thereby forming the test apparatus 100 for testing a plurality of devices under test.

Figure 12:
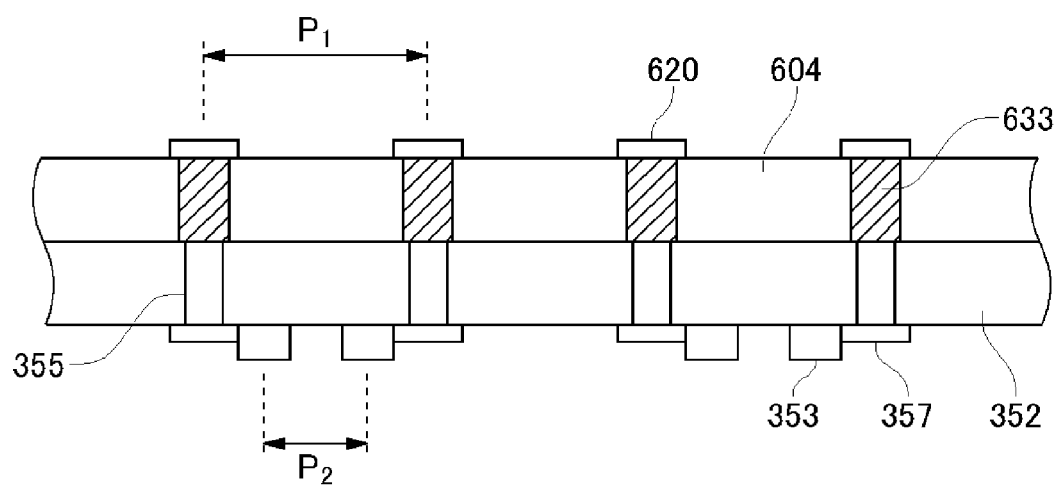
FIG. 12 is a partial cross-sectional view of a modification of the intermediate substrate 350 according to the present embodiment.

FIG. 12 is a partial cross-sectional view of a modification of the intermediate substrate 350 according to the present embodiment. In FIG. 12, components that are the same as those of FIG. 9 are given the same reference numerals and redundant descriptions are omitted. The intermediate substrate 350 includes the substrate body 352 and a connection layer 604 on the tester side surface of the substrate body 352.

The connection layer 604 is layered on the top surface of the test apparatus body side of the substrate body 352, has a plurality of tester-side intermediate electrodes 620 formed on the surface opposite the substrate body 352, and includes connecting sections 633 that electrically connect the tester-side intermediate electrodes 620 to corresponding device-side intermediate electrodes 353. The connecting sections 633 are electrically connected respectively to the corresponding tester-side intermediate electrodes 620 on the tester side surface. The connecting sections 633 are electrically connected respectively to the corresponding through-holes 355 on the device side surface.

The connection layer 604 is formed of an insulating material. The connecting sections 633 include a material that is different from the material forming the connection layer 604. At least some of the connecting sections 633 are formed by electronic components. Specifically, the device-side intermediate electrodes 353 and tester-side intermediate electrodes 620 of the intermediate substrate 350 of the present modification are electrically connected via the electronic components in the same manner as in the intermediate substrate 350 described in relation to FIG. 9. These electronic components are substantially the same as the electronic components described in FIG. 9.

The connection layer 604 may include connecting sections 633 arranged in a grid, or may include connecting sections 633 formed in a predetermined arrangement corresponding to the device pads of the device under test. In this way, in the intermediate substrate 350 of the present modification, the connection layer 604 is formed to include the connecting sections 633, and the connection layer 604 can be formed safely by using fine machining techniques such as a semiconductor process, for example.

While the embodiments of the present invention has have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A probe apparatus that provides an electrical connection between a device under test and a test apparatus body, comprising:
 a device-side terminal unit that includes a flexible sheet and a plurality of device-side connection terminals passing through the sheet and connected to the device under test;
 an intermediate substrate that is provided on the test apparatus body side of the device-side terminal unit and includes a plurality of device-side intermediate electrodes electrically connected to the device-side connection terminals and a plurality of tester-side intermediate electrodes electrically connected to the test apparatus body, the tester-side intermediate electrodes of the intermediate substrate provided at intervals greater than intervals at which the device-side intermediate electrodes are provided, the intermediate substrate including:

a substrate body including ceramic, and a plurality of connection modules that are mounted on a top surface of the substrate body on the test apparatus body side in a grid arrangement, the plurality of connection modules including a plurality of substrate-side terminals on the substrate body side thereof and the tester-side intermediate electrodes on a side thereof opposite the substrate body, the plurality of connection modules including a resistor connected to a wire between at least one substrate-side terminal and a corresponding tester-side intermediate electrode;

an anisotropic conductive film that is arranged between the device-side terminal unit and the intermediate substrate and provides a connection between the device-side connection terminals and the device-side intermediate electrodes;

a tester-side substrate that is provided on the test apparatus body side of the intermediate substrate and includes, on the intermediate substrate side thereof, a plurality of tester-side electrodes electrically connected to the test apparatus body; and a contact section that is provided between the intermediate substrate and the tester-side substrate and includes a plurality of contact blocks, each contact block connected to a corresponding connection module of the plurality of connection modules, each contact block including a plurality of first pins connected to the tester-side intermediate electrodes, a plurality of second pins connected to the tester-side electrodes, each first pin of the plurality of first pins corresponds with a corresponding second pin of the plurality of second pins, and a plurality of through-electrodes, each through electrode connecting a first pin of the plurality of first pins to the corresponding second pin of the plurality of second pins, and each through-electrode including a spring.

2. A test apparatus that tests a plurality of devices under test formed on a semiconductor wafer, comprising:

a testing section that tests the plurality of devices under test by exchanging electrical signals with the devices under test; and the probe apparatus of claim 1 that electrically connects the testing section to electrodes of each of the devices under test.

* * * * *